United States Patent
Chu et al.

(10) Patent No.: US 9,311,698 B2
(45) Date of Patent: Apr. 12, 2016

(54) DETECTING DEFECTS ON A WAFER USING TEMPLATE IMAGE MATCHING

(71) Applicants: KLA-Tencor Corporation, Milpitas, CA (US); Carmela Moreno, Fremont, CA (US)

(72) Inventors: Xing Chu, Fremont, CA (US); Jan A. Lauber, San Francisco, CA (US); J. Rex Runyon, Fremont, CA (US)

(73) Assignee: KLA-Tencor Corp., Milpitas, CA (US)

( * ) Notice: Subject to any disclaimer, the term of this patent is extended or adjusted under 35 U.S.C. 154(b) by 85 days.

(21) Appl. No.: 13/737,677

(22) Filed: Jan. 9, 2013

(65) Prior Publication Data

US 2014/0193065 A1    Jul. 10, 2014

(51) Int. Cl.
*G06T 7/00* (2006.01)
*H01L 21/66* (2006.01)

(52) U.S. Cl.
CPC .............. *G06T 7/0004* (2013.01); *H01L 22/12* (2013.01); *H01L 22/20* (2013.01); *G06T 2207/20012* (2013.01); *G06T 2207/30148* (2013.01)

(58) Field of Classification Search
None
See application file for complete search history.

(56) References Cited

U.S. PATENT DOCUMENTS

| | | |
|---|---|---|
| 3,495,269 A | 2/1970 | Mutschler et al. |
| 3,496,352 A | 2/1970 | Jugle |
| 3,909,602 A | 9/1975 | Micka |
| 4,015,203 A | 3/1977 | Verkuil |
| 4,247,203 A | 1/1981 | Levy et al. |
| 4,347,001 A | 8/1982 | Levy et al. |
| 4,378,159 A | 3/1983 | Galbraith |
| 4,448,532 A | 5/1984 | Joseph et al. |
| 4,475,122 A | 10/1984 | Green |
| 4,532,650 A | 7/1985 | Wihl et al. |
| 4,555,798 A | 11/1985 | Broadbent, Jr. et al. |
| 4,578,810 A | 3/1986 | MacFarlane et al. |
| 4,579,455 A | 4/1986 | Levy et al. |
| 4,595,289 A | 6/1986 | Feldman et al. |
| 4,599,558 A | 7/1986 | Castellano, Jr. et al. |
| 4,633,504 A | 12/1986 | Wihl |
| 4,641,353 A | 2/1987 | Kobayashi |
| 4,641,967 A | 2/1987 | Pecen |
| 4,734,721 A | 3/1988 | Boyer et al. |
| 4,748,327 A | 5/1988 | Shinozaki et al. |
| 4,758,094 A | 7/1988 | Wihl et al. |
| 4,766,324 A | 8/1988 | Saadat et al. |

(Continued)

FOREIGN PATENT DOCUMENTS

| | | |
|---|---|---|
| CN | 1339140 | 3/2002 |
| CN | 1398348 | 2/2003 |

(Continued)

OTHER PUBLICATIONS

U.S. Appl. No. 60/681,095, filed May 13, 2005 by Nehmadi et al.

(Continued)

*Primary Examiner* — David F Dunphy
(74) *Attorney, Agent, or Firm* — Ann Marie Mewherter

(57) ABSTRACT

Various embodiments for detecting defects on a wafer are provided. Some embodiments include matching a template image, in which at least some pixels are associated with regions in the device having different characteristics, to output of an electron beam inspection system and applying defect detection parameters to pixels in the output based on the regions that the pixels in the output are located within to thereby detect defects on the wafer.

35 Claims, 2 Drawing Sheets

(56) References Cited

U.S. PATENT DOCUMENTS

| | | |
|---|---|---|
| 4,799,175 A | 1/1989 | Sano et al. |
| 4,805,123 A | 2/1989 | Specht et al. |
| 4,812,756 A | 3/1989 | Curtis et al. |
| 4,814,829 A | 3/1989 | Kosugi et al. |
| 4,817,123 A | 3/1989 | Sones et al. |
| 4,845,558 A | 7/1989 | Tsai et al. |
| 4,877,326 A | 10/1989 | Chadwick et al. |
| 4,926,489 A | 5/1990 | Danielson et al. |
| 4,928,313 A | 5/1990 | Leonard et al. |
| 5,046,109 A | 9/1991 | Fujimori et al. |
| 5,124,927 A | 6/1992 | Hopewell et al. |
| 5,189,481 A | 2/1993 | Jann et al. |
| 5,355,212 A | 10/1994 | Wells et al. |
| 5,444,480 A | 8/1995 | Sumita |
| 5,453,844 A | 9/1995 | George et al. |
| 5,481,624 A | 1/1996 | Kamon |
| 5,485,091 A | 1/1996 | Verkuil |
| 5,497,381 A | 3/1996 | O'Donoghue et al. |
| 5,528,153 A | 6/1996 | Taylor et al. |
| 5,544,256 A | 8/1996 | Brecher et al. |
| 5,563,702 A | 10/1996 | Emery et al. |
| 5,572,598 A | 11/1996 | Wihl et al. |
| 5,578,821 A | 11/1996 | Meisberger et al. |
| 5,594,247 A | 1/1997 | Verkuil et al. |
| 5,608,538 A | 3/1997 | Edgar et al. |
| 5,619,548 A | 4/1997 | Koppel |
| 5,621,519 A | 4/1997 | Frost et al. |
| 5,644,223 A | 7/1997 | Verkuil |
| 5,650,731 A | 7/1997 | Fung et al. |
| 5,661,408 A | 8/1997 | Kamieniecki et al. |
| 5,689,614 A | 11/1997 | Gronet et al. |
| 5,694,478 A | 12/1997 | Braier et al. |
| 5,696,835 A | 12/1997 | Hennessey et al. |
| 5,703,969 A | 12/1997 | Hennessey et al. |
| 5,716,889 A | 2/1998 | Tsuji et al. |
| 5,737,072 A | 4/1998 | Emery et al. |
| 5,742,658 A | 4/1998 | Tiffin et al. |
| 5,754,678 A | 5/1998 | Hawthorne et al. |
| 5,767,691 A | 6/1998 | Verkuil |
| 5,767,693 A | 6/1998 | Verkuil |
| 5,771,317 A | 6/1998 | Edgar |
| 5,773,989 A | 6/1998 | Edelman et al. |
| 5,774,179 A | 6/1998 | Chevrette et al. |
| 5,795,685 A | 8/1998 | Liebmann et al. |
| 5,822,218 A | 10/1998 | Moosa et al. |
| 5,831,865 A | 11/1998 | Berezin et al. |
| 5,834,941 A | 11/1998 | Verkuil |
| 5,852,232 A | 12/1998 | Samsavar et al. |
| 5,866,806 A | 2/1999 | Samsavar et al. |
| 5,874,733 A | 2/1999 | Silver et al. |
| 5,884,242 A | 3/1999 | Meier et al. |
| 5,889,593 A | 3/1999 | Bareket |
| 5,917,332 A | 6/1999 | Chen et al. |
| 5,932,377 A | 8/1999 | Ferguson et al. |
| 5,940,458 A | 8/1999 | Suk |
| 5,948,972 A | 9/1999 | Samsavar et al. |
| 5,955,661 A | 9/1999 | Samsavar et al. |
| 5,965,306 A | 10/1999 | Mansfield et al. |
| 5,978,501 A | 11/1999 | Badger et al. |
| 5,980,187 A | 11/1999 | Verhovsky |
| 5,986,263 A | 11/1999 | Hiroi et al. |
| 5,991,699 A | 11/1999 | Kulkarni et al. |
| 5,999,003 A | 12/1999 | Steffan et al. |
| 6,011,404 A | 1/2000 | Ma et al. |
| 6,014,461 A | 1/2000 | Hennessey et al. |
| 6,040,911 A | 3/2000 | Nozaki et al. |
| 6,040,912 A | 3/2000 | Zika et al. |
| 6,052,478 A | 4/2000 | Wihl et al. |
| 6,060,709 A | 5/2000 | Verkuil et al. |
| 6,072,320 A | 6/2000 | Verkuil |
| 6,076,465 A | 6/2000 | Vacca et al. |
| 6,078,738 A | 6/2000 | Garza et al. |
| 6,091,257 A | 7/2000 | Verkuil et al. |
| 6,091,846 A | 7/2000 | Lin et al. |
| 6,097,196 A | 8/2000 | Verkuil et al. |
| 6,097,887 A | 8/2000 | Hardikar et al. |
| 6,104,206 A | 8/2000 | Verkuil |
| 6,104,835 A | 8/2000 | Han |
| 6,117,598 A | 9/2000 | Imai |
| 6,121,783 A | 9/2000 | Horner et al. |
| 6,122,017 A | 9/2000 | Taubman |
| 6,122,046 A | 9/2000 | Almogy |
| 6,137,570 A | 10/2000 | Chuang et al. |
| 6,141,038 A | 10/2000 | Young et al. |
| 6,146,627 A | 11/2000 | Muller et al. |
| 6,171,737 B1 | 1/2001 | Phan et al. |
| 6,175,645 B1 | 1/2001 | Elyasaf et al. |
| 6,184,929 B1 | 2/2001 | Noda et al. |
| 6,184,976 B1 | 2/2001 | Park et al. |
| 6,191,605 B1 | 2/2001 | Miller et al. |
| 6,201,999 B1 | 3/2001 | Jevtic |
| 6,202,029 B1 | 3/2001 | Verkuil et al. |
| 6,205,239 B1 | 3/2001 | Lin et al. |
| 6,215,551 B1 | 4/2001 | Nikoonahad et al. |
| 6,224,638 B1 | 5/2001 | Jevtic et al. |
| 6,233,719 B1 | 5/2001 | Hardikar et al. |
| 6,246,787 B1 | 6/2001 | Hennessey et al. |
| 6,248,485 B1 | 6/2001 | Cuthbert |
| 6,248,486 B1 | 6/2001 | Dirksen et al. |
| 6,259,960 B1 | 7/2001 | Inokuchi |
| 6,266,437 B1 | 7/2001 | Eichel et al. |
| 6,267,005 B1 | 7/2001 | Samsavar et al. |
| 6,268,093 B1 | 7/2001 | Kenan et al. |
| 6,272,236 B1 | 8/2001 | Pierrat et al. |
| 6,282,309 B1 | 8/2001 | Emery |
| 6,292,582 B1 | 9/2001 | Lin et al. |
| 6,295,374 B1 | 9/2001 | Robinson et al. |
| 6,324,298 B1 | 11/2001 | O'Dell et al. |
| 6,336,082 B1 | 1/2002 | Nguyen et al. |
| 6,344,640 B1 | 2/2002 | Rhoads |
| 6,363,166 B1 | 3/2002 | Wihl et al. |
| 6,366,687 B1 * | 4/2002 | Aloni et al. .................... 382/144 |
| 6,373,975 B1 | 4/2002 | Bula et al. |
| 6,388,747 B2 | 5/2002 | Nara et al. |
| 6,393,602 B1 | 5/2002 | Atchison et al. |
| 6,407,373 B1 | 6/2002 | Dotan |
| 6,415,421 B2 | 7/2002 | Anderson et al. |
| 6,445,199 B1 | 9/2002 | Satya et al. |
| 6,451,690 B1 | 9/2002 | Matsumoto et al. |
| 6,459,520 B1 | 10/2002 | Takayama |
| 6,466,314 B1 | 10/2002 | Lehman |
| 6,466,315 B1 | 10/2002 | Karpol et al. |
| 6,470,489 B1 | 10/2002 | Chang et al. |
| 6,483,938 B1 | 11/2002 | Hennessey et al. |
| 6,513,151 B1 | 1/2003 | Erhardt et al. |
| 6,526,164 B1 | 2/2003 | Mansfield et al. |
| 6,529,621 B1 | 3/2003 | Glasser et al. |
| 6,535,628 B2 | 3/2003 | Smargiassi et al. |
| 6,539,106 B1 | 3/2003 | Gallarda et al. |
| 6,569,691 B1 | 5/2003 | Jastrzebski et al. |
| 6,581,193 B1 | 6/2003 | McGhee et al. |
| 6,593,748 B1 | 7/2003 | Halliyal et al. |
| 6,597,193 B2 | 7/2003 | Lagowski et al. |
| 6,602,728 B1 | 8/2003 | Liebmann et al. |
| 6,608,681 B2 | 8/2003 | Tanaka et al. |
| 6,614,520 B1 | 9/2003 | Bareket et al. |
| 6,631,511 B2 | 10/2003 | Haffner et al. |
| 6,636,301 B1 | 10/2003 | Kvamme et al. |
| 6,642,066 B1 | 11/2003 | Halliyal et al. |
| 6,658,640 B2 | 12/2003 | Weed |
| 6,665,065 B1 | 12/2003 | Phan et al. |
| 6,670,082 B2 | 12/2003 | Liu et al. |
| 6,680,621 B2 | 1/2004 | Savtchouk |
| 6,691,052 B1 | 2/2004 | Maurer |
| 6,701,004 B1 | 3/2004 | Shykind et al. |
| 6,718,526 B1 | 4/2004 | Eldredge et al. |
| 6,721,695 B1 | 4/2004 | Chen et al. |
| 6,734,696 B2 | 5/2004 | Horner et al. |
| 6,738,954 B1 | 5/2004 | Allen et al. |
| 6,748,103 B2 | 6/2004 | Glasser et al. |
| 6,751,519 B1 | 6/2004 | Satya et al. |
| 6,753,954 B2 | 6/2004 | Chen |
| 6,757,645 B2 | 6/2004 | Chang et al. |
| 6,759,655 B2 | 7/2004 | Nara et al. |

(56) References Cited

U.S. PATENT DOCUMENTS

| | | |
|---|---|---|
| 6,771,806 B1 | 8/2004 | Satya et al. |
| 6,775,818 B2 | 8/2004 | Taravade et al. |
| 6,777,147 B1 | 8/2004 | Fonseca et al. |
| 6,777,676 B1 | 8/2004 | Wang et al. |
| 6,778,695 B1 | 8/2004 | Schellenberg et al. |
| 6,779,159 B2 | 8/2004 | Yokoyama et al. |
| 6,784,446 B1 | 8/2004 | Phan et al. |
| 6,788,400 B2 | 9/2004 | Chen |
| 6,789,032 B2 | 9/2004 | Barbour et al. |
| 6,803,554 B2 | 10/2004 | Ye et al. |
| 6,806,456 B1 | 10/2004 | Ye et al. |
| 6,807,503 B2 | 10/2004 | Ye et al. |
| 6,813,572 B2 | 11/2004 | Satya et al. |
| 6,820,028 B2 | 11/2004 | Ye et al. |
| 6,828,542 B2 | 12/2004 | Ye et al. |
| 6,842,225 B1 | 1/2005 | Irie et al. |
| 6,859,746 B1 | 2/2005 | Stirton |
| 6,879,403 B2 | 4/2005 | Freifeld |
| 6,879,924 B2 | 4/2005 | Ye et al. |
| 6,882,745 B2 | 4/2005 | Brankner et al. |
| 6,884,984 B2 | 4/2005 | Ye et al. |
| 6,886,153 B1 | 4/2005 | Bevis |
| 6,892,156 B2 | 5/2005 | Ye et al. |
| 6,902,855 B2 | 6/2005 | Peterson et al. |
| 6,906,305 B2 | 6/2005 | Pease et al. |
| 6,918,101 B1 | 7/2005 | Satya et al. |
| 6,919,957 B2 | 7/2005 | Nikoonahad et al. |
| 6,937,753 B1 | 8/2005 | O'Dell et al. |
| 6,948,141 B1 | 9/2005 | Satya et al. |
| 6,959,255 B2 | 10/2005 | Ye et al. |
| 6,966,047 B1 | 11/2005 | Glasser |
| 6,969,837 B2 | 11/2005 | Ye et al. |
| 6,969,864 B2 | 11/2005 | Ye et al. |
| 6,983,060 B1 | 1/2006 | Martinent-Catalot et al. |
| 6,988,045 B2 | 1/2006 | Purdy |
| 6,990,385 B1 | 1/2006 | Smith et al. |
| 7,003,755 B2 | 2/2006 | Pang et al. |
| 7,003,758 B2 | 2/2006 | Ye et al. |
| 7,012,438 B1 | 3/2006 | Miller et al. |
| 7,026,615 B2 | 4/2006 | Takane et al. |
| 7,027,143 B1 | 4/2006 | Stokowski et al. |
| 7,030,966 B2 | 4/2006 | Hansen |
| 7,030,997 B2 | 4/2006 | Neureuther et al. |
| 7,053,355 B2 | 5/2006 | Ye et al. |
| 7,061,625 B1 | 6/2006 | Hwang et al. |
| 7,071,833 B2 | 7/2006 | Nagano et al. |
| 7,103,484 B1 | 9/2006 | Shi et al. |
| 7,106,895 B1 | 9/2006 | Goldberg et al. |
| 7,107,517 B1 | 9/2006 | Suzuki et al. |
| 7,107,571 B2 | 9/2006 | Chang et al. |
| 7,111,277 B2 | 9/2006 | Ye et al. |
| 7,114,143 B2 | 9/2006 | Hanson et al. |
| 7,114,145 B2 | 9/2006 | Ye et al. |
| 7,117,477 B2 | 10/2006 | Ye et al. |
| 7,117,478 B2 | 10/2006 | Ye et al. |
| 7,120,285 B1 | 10/2006 | Spence |
| 7,120,895 B2 | 10/2006 | Ye et al. |
| 7,123,356 B1 | 10/2006 | Stokowski et al. |
| 7,124,386 B2 | 10/2006 | Smith et al. |
| 7,133,548 B2 | 11/2006 | Kenan et al. |
| 7,135,344 B2 | 11/2006 | Nehmadi et al. |
| 7,136,143 B2 | 11/2006 | Smith |
| 7,152,215 B2 | 12/2006 | Smith et al. |
| 7,162,071 B2 | 1/2007 | Hung et al. |
| 7,170,593 B2 | 1/2007 | Honda et al. |
| 7,171,334 B2 | 1/2007 | Gassner |
| 7,174,520 B2 | 2/2007 | White et al. |
| 7,194,709 B2 | 3/2007 | Brankner |
| 7,207,017 B1 | 4/2007 | Tabery et al. |
| 7,231,628 B2 | 6/2007 | Pack et al. |
| 7,236,847 B2 | 6/2007 | Marella |
| 7,271,891 B1 | 9/2007 | Xiong et al. |
| 7,379,175 B1 | 5/2008 | Stokowski et al. |
| 7,383,156 B2 | 6/2008 | Matsusita et al. |
| 7,386,839 B1 | 6/2008 | Golender et al. |
| 7,388,979 B2 | 6/2008 | Sakai et al. |
| 7,418,124 B2 | 8/2008 | Peterson et al. |
| 7,424,145 B2 | 9/2008 | Horie et al. |
| 7,440,093 B1 | 10/2008 | Xiong et al. |
| 7,570,796 B2 | 8/2009 | Zafar et al. |
| 7,676,077 B2 | 3/2010 | Kulkarni et al. |
| 7,683,319 B2 | 3/2010 | Makino et al. |
| 7,738,093 B2 | 6/2010 | Alles et al. |
| 7,739,064 B1 | 6/2010 | Ryker et al. |
| 7,752,584 B2 | 7/2010 | Yang |
| 7,760,929 B2 | 7/2010 | Orbon et al. |
| 7,769,225 B2 | 8/2010 | Kekare et al. |
| 7,774,153 B1 | 8/2010 | Smith |
| 7,877,722 B2 | 1/2011 | Duffy et al. |
| 7,890,917 B1 | 2/2011 | Young et al. |
| 7,904,845 B2 | 3/2011 | Fouquet et al. |
| 7,968,859 B2 | 6/2011 | Young et al. |
| 8,041,103 B2 | 10/2011 | Kulkarni et al. |
| 8,073,240 B2 | 12/2011 | Fischer et al. |
| 8,112,241 B2 | 2/2012 | Xiong |
| 8,126,255 B2 | 2/2012 | Bhaskar et al. |
| 8,204,297 B1 | 6/2012 | Xiong et al. |
| 2001/0017694 A1 | 8/2001 | Oomori et al. |
| 2001/0019625 A1 | 9/2001 | Kenan et al. |
| 2001/0022858 A1 | 9/2001 | Komiya et al. |
| 2001/0043735 A1 | 11/2001 | Smargiassi et al. |
| 2002/0010560 A1 | 1/2002 | Balachandran |
| 2002/0019729 A1 | 2/2002 | Chang et al. |
| 2002/0026626 A1 | 2/2002 | Randall et al. |
| 2002/0033449 A1 | 3/2002 | Nakasuji et al. |
| 2002/0035461 A1 | 3/2002 | Chang et al. |
| 2002/0035641 A1 | 3/2002 | Kurose et al. |
| 2002/0035717 A1 | 3/2002 | Matsuoka |
| 2002/0054291 A1 | 5/2002 | Tsai et al. |
| 2002/0088951 A1 | 7/2002 | Chen |
| 2002/0090746 A1 | 7/2002 | Xu et al. |
| 2002/0134936 A1 | 9/2002 | Matsui et al. |
| 2002/0144230 A1 | 10/2002 | Rittman |
| 2002/0145734 A1 | 10/2002 | Watkins et al. |
| 2002/0164065 A1 | 11/2002 | Cai et al. |
| 2002/0168099 A1 | 11/2002 | Noy |
| 2002/0176096 A1 | 11/2002 | Sentoku et al. |
| 2002/0181756 A1 | 12/2002 | Shibuya et al. |
| 2002/0186878 A1 | 12/2002 | Hoon et al. |
| 2002/0192578 A1 | 12/2002 | Tanaka et al. |
| 2003/0004699 A1 | 1/2003 | Choi et al. |
| 2003/0014146 A1 | 1/2003 | Fujii et al. |
| 2003/0017664 A1 | 1/2003 | Pnueli et al. |
| 2003/0022401 A1 | 1/2003 | Hamamatsu et al. |
| 2003/0033046 A1 | 2/2003 | Yoshitake et al. |
| 2003/0048458 A1 | 3/2003 | Mieher et al. |
| 2003/0048939 A1 | 3/2003 | Lehman |
| 2003/0057971 A1 | 3/2003 | Nishiyama et al. |
| 2003/0076989 A1 | 4/2003 | Maayah et al. |
| 2003/0086081 A1 | 5/2003 | Lehman |
| 2003/0094572 A1 | 5/2003 | Matsui et al. |
| 2003/0098805 A1 | 5/2003 | Bizjak et al. |
| 2003/0128870 A1 | 7/2003 | Pease et al. |
| 2003/0138138 A1 | 7/2003 | Vacca et al. |
| 2003/0138978 A1 | 7/2003 | Tanaka et al. |
| 2003/0169916 A1 | 9/2003 | Hayashi et al. |
| 2003/0173516 A1 | 9/2003 | Takane et al. |
| 2003/0192015 A1 | 10/2003 | Liu |
| 2003/0207475 A1 | 11/2003 | Nakasuji et al. |
| 2003/0223639 A1 | 12/2003 | Shlain et al. |
| 2003/0226951 A1 | 12/2003 | Ye et al. |
| 2003/0227620 A1 | 12/2003 | Yokoyama et al. |
| 2003/0228714 A1 | 12/2003 | Smith et al. |
| 2003/0229410 A1 | 12/2003 | Smith et al. |
| 2003/0229412 A1 | 12/2003 | White et al. |
| 2003/0229868 A1 | 12/2003 | White et al. |
| 2003/0229875 A1 | 12/2003 | Smith et al. |
| 2003/0229880 A1 | 12/2003 | White et al. |
| 2003/0229881 A1 | 12/2003 | White et al. |
| 2003/0237064 A1 | 12/2003 | White et al. |
| 2004/0030430 A1 | 2/2004 | Matsuoka |
| 2004/0032908 A1 | 2/2004 | Hagai et al. |
| 2004/0049722 A1 | 3/2004 | Matsushita |
| 2004/0052411 A1 | 3/2004 | Qian et al. |

(56) References Cited

U.S. PATENT DOCUMENTS

| | | |
|---|---|---|
| 2004/0057611 A1 | 3/2004 | Lee et al. |
| 2004/0066506 A1 | 4/2004 | Elichai et al. |
| 2004/0091142 A1 | 5/2004 | Peterson et al. |
| 2004/0094762 A1 | 5/2004 | Hess et al. |
| 2004/0098216 A1 | 5/2004 | Ye et al. |
| 2004/0102934 A1 | 5/2004 | Chang |
| 2004/0107412 A1 | 6/2004 | Pack et al. |
| 2004/0119036 A1 | 6/2004 | Ye et al. |
| 2004/0120569 A1 | 6/2004 | Hung et al. |
| 2004/0133369 A1 | 7/2004 | Pack et al. |
| 2004/0147121 A1 | 7/2004 | Nakagaki et al. |
| 2004/0174506 A1 | 9/2004 | Smith |
| 2004/0179738 A1 | 9/2004 | Dai et al. |
| 2004/0199885 A1 | 10/2004 | Lu et al. |
| 2004/0223639 A1 | 11/2004 | Sato et al. |
| 2004/0228515 A1 | 11/2004 | Okabe et al. |
| 2004/0234120 A1 | 11/2004 | Honda et al. |
| 2004/0243320 A1 | 12/2004 | Chang et al. |
| 2004/0246476 A1 | 12/2004 | Bevis et al. |
| 2004/0254752 A1 | 12/2004 | Wisniewski et al. |
| 2005/0004774 A1 | 1/2005 | Volk et al. |
| 2005/0008218 A1 | 1/2005 | O'Dell et al. |
| 2005/0010890 A1 | 1/2005 | Nehmadi et al. |
| 2005/0013474 A1 | 1/2005 | Sim |
| 2005/0062962 A1 | 3/2005 | Fairley et al. |
| 2005/0069217 A1 | 3/2005 | Mukherjee |
| 2005/0117796 A1 | 6/2005 | Matsui et al. |
| 2005/0132306 A1 | 6/2005 | Smith et al. |
| 2005/0141764 A1 | 6/2005 | Tohyama et al. |
| 2005/0166174 A1 | 7/2005 | Ye et al. |
| 2005/0184252 A1 | 8/2005 | Ogawa et al. |
| 2005/0190957 A1 | 9/2005 | Cai et al. |
| 2005/0198602 A1 | 9/2005 | Brankner et al. |
| 2006/0000964 A1 | 1/2006 | Ye et al. |
| 2006/0036979 A1 | 2/2006 | Zurbrick et al. |
| 2006/0038986 A1 | 2/2006 | Honda et al. |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0066339 A1 | 3/2006 | Rajski et al. |
| 2006/0078192 A1* | 4/2006 | Oh .................. G06K 9/3216 382/151 |
| 2006/0082763 A1 | 4/2006 | Teh et al. |
| 2006/0159333 A1 | 7/2006 | Ishikawa |
| 2006/0161452 A1 | 7/2006 | Hess |
| 2006/0193506 A1 | 8/2006 | Dorphan et al. |
| 2006/0193507 A1 | 8/2006 | Sali et al. |
| 2006/0236294 A1 | 10/2006 | Saidin et al. |
| 2006/0236297 A1 | 10/2006 | Melvin, III et al. |
| 2006/0239536 A1 | 10/2006 | Shibuya et al. |
| 2006/0265145 A1 | 11/2006 | Huet et al. |
| 2006/0266243 A1 | 11/2006 | Percin et al. |
| 2006/0269120 A1 | 11/2006 | Nehmadi et al. |
| 2006/0273242 A1 | 12/2006 | Hunsche et al. |
| 2006/0273266 A1 | 12/2006 | Preil et al. |
| 2006/0277520 A1 | 12/2006 | Gennari |
| 2006/0291714 A1 | 12/2006 | Wu et al. |
| 2006/0292463 A1 | 12/2006 | Best et al. |
| 2007/0002322 A1 | 1/2007 | Borodovsky et al. |
| 2007/0011628 A1 | 1/2007 | Ouali et al. |
| 2007/0013901 A1 | 1/2007 | Kim et al. |
| 2007/0019171 A1 | 1/2007 | Smith |
| 2007/0019856 A1 | 1/2007 | Furman et al. |
| 2007/0031745 A1 | 2/2007 | Ye et al. |
| 2007/0032896 A1 | 2/2007 | Ye et al. |
| 2007/0035322 A1 | 2/2007 | Kang et al. |
| 2007/0035712 A1 | 2/2007 | Gassner et al. |
| 2007/0035728 A1 | 2/2007 | Kekare et al. |
| 2007/0052963 A1 | 3/2007 | Orbon et al. |
| 2007/0064995 A1 | 3/2007 | Oaki et al. |
| 2007/0133860 A1 | 6/2007 | Lin et al. |
| 2007/0156379 A1 | 7/2007 | Kulkarni et al. |
| 2007/0230770 A1 | 10/2007 | Kulkarni et al. |
| 2007/0248257 A1 | 10/2007 | Bruce et al. |
| 2007/0280527 A1 | 12/2007 | Almogy et al. |
| 2007/0288219 A1 | 12/2007 | Zafar et al. |
| 2008/0013083 A1 | 1/2008 | Kirk et al. |
| 2008/0015802 A1 | 1/2008 | Urano et al. |
| 2008/0016481 A1* | 1/2008 | Matsuoka et al. .......... 716/6 |
| 2008/0016887 A1 | 1/2008 | Chen et al. |
| 2008/0049994 A1 | 2/2008 | Rognin et al. |
| 2008/0058977 A1 | 3/2008 | Honda |
| 2008/0072207 A1 | 3/2008 | Verma et al. |
| 2008/0081385 A1 | 4/2008 | Marella et al. |
| 2008/0163140 A1 | 7/2008 | Fouquet et al. |
| 2008/0167829 A1 | 7/2008 | Park et al. |
| 2008/0250384 A1 | 10/2008 | Duffy et al. |
| 2008/0295047 A1 | 11/2008 | Nehmadi et al. |
| 2008/0295048 A1 | 11/2008 | Nehmadi et al. |
| 2008/0304056 A1 | 12/2008 | Alles et al. |
| 2009/0024967 A1 | 1/2009 | Su et al. |
| 2009/0037134 A1 | 2/2009 | Kulkarni et al. |
| 2009/0041332 A1 | 2/2009 | Bhaskar et al. |
| 2009/0043527 A1 | 2/2009 | Park et al. |
| 2009/0055783 A1 | 2/2009 | Florence et al. |
| 2009/0067703 A1* | 3/2009 | Lin et al. ................ 382/149 |
| 2009/0080759 A1 | 3/2009 | Bhaskar et al. |
| 2009/0210183 A1 | 8/2009 | Rajski et al. |
| 2009/0257645 A1 | 10/2009 | Chen et al. |
| 2009/0284733 A1 | 11/2009 | Wallingford et al. |
| 2009/0290782 A1 | 11/2009 | Regensburger |
| 2009/0299681 A1 | 12/2009 | Chen et al. |
| 2009/0323052 A1 | 12/2009 | Silberstein et al. |
| 2010/0142800 A1 | 6/2010 | Pak et al. |
| 2010/0146338 A1 | 6/2010 | Schalick et al. |
| 2010/0150429 A1 | 6/2010 | Jau et al. |
| 2010/0188657 A1 | 7/2010 | Chen et al. |
| 2010/0226562 A1 | 9/2010 | Wu et al. |
| 2011/0013825 A1* | 1/2011 | Shibuya et al. ............ 382/149 |
| 2011/0052040 A1 | 3/2011 | Kuan |
| 2011/0184662 A1 | 7/2011 | Badger et al. |
| 2011/0251713 A1 | 10/2011 | Teshima et al. |
| 2011/0276935 A1 | 11/2011 | Fouquet et al. |
| 2011/0311126 A1* | 12/2011 | Sakai et al. .............. 382/149 |
| 2012/0308112 A1 | 12/2012 | Hu et al. |
| 2012/0319246 A1 | 12/2012 | Tan et al. |
| 2013/0009989 A1 | 1/2013 | Chen et al. |
| 2013/0027196 A1 | 1/2013 | Yankun et al. |
| 2013/0336575 A1* | 12/2013 | Dalla-Torre et al. ....... 382/149 |

FOREIGN PATENT DOCUMENTS

| | | |
|---|---|---|
| CN | 1646896 | 7/2005 |
| EP | 0032197 | 7/1981 |
| EP | 0370322 | 5/1990 |
| EP | 1061358 | 12/2000 |
| EP | 1061571 | 12/2000 |
| EP | 1065567 | 1/2001 |
| EP | 1066925 | 1/2001 |
| EP | 1069609 | 1/2001 |
| EP | 1093017 | 4/2001 |
| EP | 1329771 | 7/2003 |
| EP | 1480034 | 11/2004 |
| EP | 1696270 | 8/2006 |
| JP | 7-159337 | 6/1995 |
| JP | 2002-071575 | 3/2002 |
| JP | 2002-365235 | 12/2002 |
| JP | 2003-215060 | 7/2003 |
| JP | 2004-045066 | 2/2004 |
| JP | 2005-283326 | 10/2005 |
| JP | 2007-234798 | 9/2007 |
| JP | 2009-122046 | 6/2009 |
| JP | 2010-256242 | 11/2010 |
| JP | 2012-225768 | 11/2012 |
| KR | 10-2001-0007394 | 1/2001 |
| KR | 10-2001-0037026 | 5/2001 |
| KR | 10-2001-0101697 | 11/2001 |
| KR | 10-2003-0055848 | 7/2003 |
| KR | 10-2006-0075691 | 7/2005 |
| KR | 10-2005-0092053 | 9/2005 |
| KR | 10-2006-0124514 | 12/2006 |
| KR | 10-0696276 | 3/2007 |
| KR | 10-2010-0061018 | 6/2010 |
| KR | 10-2012-0068128 | 6/2012 |

(56) References Cited

FOREIGN PATENT DOCUMENTS

| WO | 98/57358 | 12/1998 |
|---|---|---|
| WO | 99/22310 | 5/1999 |
| WO | 99/25004 | 5/1999 |
| WO | 99/59200 | 5/1999 |
| WO | 99/38002 | 7/1999 |
| WO | 99/41434 | 8/1999 |
| WO | 00/03234 | 1/2000 |
| WO | 00/36525 | 6/2000 |
| WO | 00/55799 | 9/2000 |
| WO | 00/68884 | 11/2000 |
| WO | 00/70332 | 11/2000 |
| WO | 01/09566 | 2/2001 |
| WO | 01/40145 | 6/2001 |
| WO | 03/104921 | 12/2003 |
| WO | 2004/027684 | 4/2004 |
| WO | 2004/097903 | 11/2004 |
| WO | 2006/012388 | 2/2006 |
| WO | 2006/063268 | 6/2006 |
| WO | 2009/018337 | 2/2009 |
| WO | 2009/152046 | 9/2009 |
| WO | 2010/093733 | 8/2010 |

OTHER PUBLICATIONS

U.S. Appl. No. 60/684,360, filed May 24, 2005 by Nehmadi et al.

U.S. Appl. No. 13/652,377, filed Oct. 15, 2012 by Wu et al.

Allan et al., "Critical Area Extraction for Soft Fault Estimation," IEEE Transactions on Semiconductor Manufacturing, vol. 11, No. 1, Feb. 1998.

Barty et al., "Aerial Image Microscopes for the inspection of defects in EUV masks," Proceedings of SPIE, vol. 4889, 2002, pp. 1073-1084.

Budd et al., "A New Mask Evaluation Tool, the Microlithography Simulation Microscope Aerial Image Measurement System," SPIE vol. 2197, 1994, pp. 530-540.

Cai et al., "Enhanced Dispositioning of Reticle Defects Using the Virtual Stepper With Automoated Defect Severity Scoring," Proceedings of the SPIE, vol. 4409, Jan. 2001, pp. 467-478.

Comizzoli, "Uses of Corona Discharges in the Semiconductor Industry," J. Electrochem. Soc., 1987, pp. 424-429.

Contactless Electrical Equivalent Oxide Thickness Measurement, IBM Technical Disclosure Bulletin, vol. 29, No. 10, 1987, pp. 4622-4623.

Contactless Photovoltage vs. Bias Method for Determining Flat-Band Voltage, IBM Technical Disclosure Bulletin, vol. 32, vol. 9A, 1990, pp. 14-17.

Cosway et al., "Manufacturing Implementation of Corona Oxide Silicon (COS) Systems for Diffusion Furnace Contamination Monitoring," 1997 IEEE/SEMI Advanced Semiconductor Manufacturing Conference, pp. 98-102.

Diebold et al., "Characterization and produiction metrology of thin transistor gate oxide films," Materials Science in Semiconductor Processing 2, 1999, pp. 103-147.

Dirksen et al., "Impact of high order aberrations on the performance of the aberration monitor," Proc. of SPIE vol. 4000, Mar. 2000, pp. 9-17.

Dirksen et al., "Novel aberration monitor for optical lithography," Proc. of SPIE vol. 3679, Jul. 1999, pp. 77-86.

Garcia et al., "New Die to Database Inspection Algorithm for Inspection of 90-nm Node Reticles," Proceedings of SPIE, vol. 5130, 2003, pp. 364-374.

Granik et al., "Sub-resolution process windows and yield estimation technique based on detailed full-chip CD simulation," Mentor Graphics, Sep. 2000, 5 pages.

Hess et al., "A Novel Approach: High Resolution Inspection with Wafer Plane Defect Detection," Proceedings of SPIE—International Society for Optical Engineering; Photomask and Next-Generation Lithography Mask Technology 2008, vol. 7028, 2008.

Huang et al., "Process Window Impact of Progressive Mask Defects, Its Inspection and Disposition Techniques (go/no-go criteria) Via a Lithographic Detector," Proceedings of SPIE—The International Society for Optical Engineering; 25th Annual Bacus Symposium on Photomask Technology 2005, vol. 5992, No. 1, 2005, p. 6.

Huang et al., "Using Design Based Binning to Improve Defect Excursion Control for 45nm Production," IEEE, International Symposium on Semiconductor Manufacturing, Oct. 2007, pp. 1-3.

Hung et al., Metrology Study of Sub 20 Angstrom oxynitride by Corona-Oxide—Silicon (COS) and Conventional C-V Approaches, 2002, Mat. Res. Soc. Symp. Proc., vol. 716, pp. 119-124.

Karklin et al., "Automatic Defect Severity Scoring for 193 nm Reticle Defect Inspection," Proceedings of SPIE—The International Society for Optical Engineering, 2001, vol. 4346, No. 2, pp. 898-906.

Lo et al., "Identifying Process Window Marginalities of Reticle Designs for 0.15/0.13 µm Technologies," Proceedings of SPIE vol. 5130, 2003, pp. 829-837.

Lorusso et al. "Advanced DFM Applns. Using design-based metrology on CDSEM," SPIE vol. 6152, Mar. 27, 2006.

Lu et al., "Application of Simulation Based Defect Printability Analysis for Mask Qualification Control," Proceedings of SPIE, vol. 5038, 2003, pp. 33-40.

Mack, "Lithographic Simulation: A Review," Proceedings of SPIE vol. 4440, 2001, pp. 59-72.

Martino et al., "Application of the Aerial Image Measurement System (AIMS(TM)) to the Analysis of Binary Mask Imaging and Resolution Enhancement Techniques," SPIE vol. 2197, 1994, pp. 573-584.

Miller, "A New Approach for Measuring Oxide Thickness," Semiconductor International, Jul. 1995, pp. 147-148.

Nagpal et al., "Wafer Plane Inspection for Advanced Reticle Defects," Proceedings of SPIE—The International Society for Optical Engineering; Photomask and Next-Generation Lithography Mask Technology. vol. 7028, 2008.

Numerical Recipes in C. The Art of Scientific Computing, 2nd Ed., © Cambridge University Press 1988, 1992, p. 683.

O'Gorman et al., "Subpixel Registration Using a Concentric Ring Fiducial," Proceedings of the International Conference on Pattern Recognition, vol. ii, Jun. 16, 1990, pp. 249-253.

Otsu, "A Threshold Selection Method from Gray-Level Histograms," IEEE Transactions on Systems, Man, and Cybernetics, vol. SMC-9, No. 1, Jan. 1979, pp. 62-66.

Pang et al., "Simulation-based Defect Printability Analysis on Alternating Phase Shifting Masks for 193 nm Lithography," Proceedings of SPIE, vol. 4889, 2002, pp. 947-954.

Pettibone et al., "Wafer Printability Simulation Accuracy Based on UV Optical Inspection Images of Reticle Defects," Proceedings of SPIE—The International Society for Optical Engineering 1999 Society of Photo-Optical Instrumentation Engineers, vol. 3677, No. II, 1999, pp. 711-720.

Phan et al., "Comparison of Binary Mask Defect Printability Analysis Using Virtual Stepper System and Aerial Image Microscope System," Proceedings of SPIE—The International Society for Optical Engineering 1999 Society of Photo-Optical Instrumentation Engineers, vol. 3873, 1999, pp. 681-692.

Sahouria et al., "Full-chip Process Simulation for Silicon DRC," Mentor Graphics, Mar. 2000, 6 pages.

Sato et al., "Defect Criticality Index (DCI): A new methodology to significantly improve DOI sampling rate in a 45nm production environment," Metrology, Inspection, and Process Control for Microlithography XXII, Proc. of SPIE vol. 6922, 692213 (2008), pp. 1-9.

Schroder et al., Corona-Oxide-Semiconductor Device Characterization, 1998, Solid-State Electronics, vol. 42, No. 4, pp. 505-512.

Schroder, "Surface voltage and surface photovoltage: history, theory and applications," Measurement Science and Technology, vol. 12, 2001, pp. R16-31.

Schroder, Contactless Surface Charge Semiconductor Characterization, Apr. 2002, Materials Science and Engineering B, vol. 91-92, pp. 196-228.

Schurz et al., "Simulation Study of Reticle Enhancement Technology Applications for 157 nm Lithography," SPIE vol. 4562, 2002, pp. 902-913.

Svidenko et al. "Dynamic Defect-Limited Yield Prediction by Criticality Factor," ISSM Paper: YE-O-157, 2007.

(56) References Cited

OTHER PUBLICATIONS

Tang et al., "Analyzing Volume Diagnosis Results with Statistical Learning for Yield Improvement" 12th IEEE European Test Symposium, Freiburg 2007, IEEE European, May 20-24, 2007, pp. 145-150.

Verkuil et al., "A Contactless Alternative to MOS Charge Measurements by Means of a Corona-Oxide-Semiconductor (COS) Technique," Electrochem. Soc. Extended Abstracts, 1988, vol. 88-1, No. 169, pp. 261-262.

Verkuil, "Rapid Contactless Method for Measuring Fixed Oxide Charge Associated with Silicon Processing," IBM Technical Disclosure Bulletin, vol. 24, No. 6, 1981, pp. 3048-3053.

Volk et al. "Investigation of Reticle Defect Formation at DUV Lithography," 2002, BACUS Symposium on Photomask Technology.

Volk et al. "Investigation of Reticle Defect Formation at DUV Lithography," 2003, IEEE/SEMI Advanced Manufacturing Conference, pp. 29-35.

Volk et al., "Investigation of Smart Inspection of Critical Layer Reticles using Additional Designer Data to Determine Defect Significance," Proceedings of SPIE vol. 5256, 2003, pp. 489-499.

Weinberg, "Tunneling of Electrons from Si into Thermally Grown $SiO_2$," Solid-State Electronics, 1977, vol. 20, pp. 11-18.

Weinzierl et al., "Non-Contact Corona-Based Process Control Measurements: Where We've Been, Where We're Headed," Electrochemical Society Proceedings, Oct. 1999, vol. 99-16, pp. 342-350.

Yan et al., "Printability of Pellicle Defects in DUV 0.5 um Lithography," SPIE vol. 1604, 1991, pp. 106-117.

Guo et al., "License Plate Localization and Character Segmentation with Feedback Self-Learning and Hybrid Binarization Techniques," IEEE Transactions on Vehicular Technology, vol. 57, No. 3, May 2008, pp. 1417-1424.

Liu, "Robust Image Segmentation Using Local Median," Proceedings of the 3rd Canadian Conference on Computer and Robot Vision (CRV'06) 0-7695-2542-3/06, 2006 IEEE, 7 pages total.

International Search Report and Written Opinion for PCT/US2014/010743 mailed Jun. 20, 2014.

* cited by examiner

DETECTING DEFECTS ON A WAFER USING TEMPLATE IMAGE MATCHING

BACKGROUND OF THE INVENTION

1. Field of the Invention

The present invention generally relates to detecting defects on a wafer using template image matching.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices. However, as the dimensions of semiconductor devices decrease, inspection becomes even more important to the successful manufacture of acceptable semiconductor devices because smaller defects can cause the devices to fail.

Inspection generally involves applying some defect detection parameters to output generated by scanning and/or imaging a wafer. The defect detection parameters may include a threshold that is applied to the output or to a difference between the output and some reference output. Different detection thresholds can be set depending on varying characteristics of the output such as brightness and/or noise due to roughness of different regions of a device, but typically not depending on the locations of the regions within the inspected area. There is no easy way to treat different regions in the output separately according to the device context resolved in the output.

Information beyond simple defect detection is often generated during inspection processes. For example, the detected defects are often classified into different groups. In one such example, after finding defects, they may be classified into different groups based on the defect characteristics such as size, magnitude, and location. Defects can also be classified based on the information contained within a patch image, a relatively small subsection of the full image. Sometimes, the context in which a defect was found cannot be determined from a patch image alone, requiring a larger section of the image surrounding the defect.

Accordingly, it would be advantageous to develop methods and systems for detecting defects on a wafer that do not have one or more of the disadvantages described above.

SUMMARY OF THE INVENTION

The following description of various embodiments is not to be construed in any way as limiting the subject matter of the appended claims.

One embodiment relates to a computer-implemented method for detecting defects on a wafer. The method includes generating a template image using information about a device being formed on the wafer. At least some pixels in the template image are associated with regions in the device having different characteristics. The method also includes acquiring output of an electron beam inspection system for the wafer and matching the template image to the output based on patterns in the template image and the output. In addition, the method includes identifying the regions that pixels in the output are located within based on the regions that are associated with the pixels of the template image that match the pixels in the output. The method further includes applying defect detection parameters to the pixels in the output based on the regions that the pixels are located within to thereby detect defects on the wafer. The steps described above are performed by a computer system.

Each of the steps of the method described above may be further performed as described herein. In addition, the method described above may include any other step(s) of any other method(s) described herein. Furthermore, the method described above may be performed by any of the systems described herein.

Another embodiment relates to a non-transitory computer-readable medium containing program instructions stored therein for causing a computer system to perform a computer-implemented method for detecting defects on a wafer. The computer-implemented method includes the steps of the method described above. The computer-readable medium may be further configured as described herein. The steps of the method may be performed as described further herein. In addition, the method may include any other step(s) of any other method(s) described herein.

An additional embodiment relates to a system configured to detect defects on a wafer. The system includes an electron beam inspection subsystem configured to acquire output for a wafer. The system also includes a computer subsystem configured to generate a template image using information about a device being formed on the wafer. At least some pixels in the template image are associated with regions in the device having different characteristics. The computer subsystem is also configured to match the template image to the output based on patterns in the template image and the output and to identify the regions that pixels in the output are located within based on the regions that are associated with the pixels of the template image that match the pixels in the output. The computer subsystem is further configured to apply defect detection parameters to the pixels in the output based on the regions that the pixels are located within to thereby detect defects on the wafer. The system may be further configured according to any embodiment(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
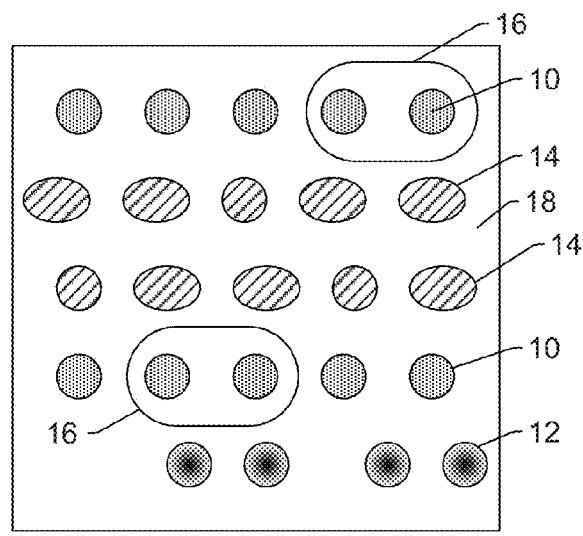
FIG. 1 is a schematic diagram illustrating a plan view of one embodiment of a template image that may be generated according to embodiments described herein.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals.

One embodiment relates to a computer-implemented method for detecting defects on a wafer. The method includes generating a template image using information about a device being formed on a wafer. At least some pixels in the template image are associated with regions in the device having different characteristics. The method, therefore, partitions a semiconductor device to be inspected into different regions of interest (ROIs) according to the device context. The device context (or a section of it) may then be rendered into a template image appropriate for inspection.

The different characteristics of the regions in the device may include different electrical characteristics that the regions will have in the final manufactured device. For example, as described further herein, different contacts within an array area of a device may have different electrical functions in the completed device and therefore may have different electrical characteristics. Each of the contacts having the same electrical functions may be grouped into one region while the electrical functions of contacts in different regions may be different. Other disparate device elements may be similarly grouped. For example, each contact, regardless of its region, may be in a region different than the dielectric material that electrically insulates the contacts from each other.

In one embodiment, the information includes design data for the device. For example, device context can be obtained in the form of a device layout design database (e.g., GDSII files) and may include any design information known in the art. In another embodiment, the information includes a high resolution image of the device being formed on the wafer. For example, device context information can be obtained in the form of relatively high resolution images of the device to be inspected. A "high resolution image," as used herein, generally refers to any image in which the patterns on the wafer are resolved, and are preferably relatively well resolved, such that information about patterns in the device formed on the wafer can be determined from the image with relatively high accuracy. High resolution images of patterns of a device formed on a wafer can be acquired using, for example, an electron beam inspection system. In this manner, the context can be derived empirically from a relatively good quality image.

In one embodiment, the method includes determining the regions that the pixels in the template image are associated with prior to acquiring the output as described further herein. For example, the method may partition the semiconductor device into different ROIs prior to the inspection of the wafer. The template image with the information for the different regions may then be stored into some file or data structure that can be accessed by the inspection system that will be performing the inspection of the wafer. In to addition, the template image and the associated information may be used for the inspection of more than one wafer.

In another embodiment, the method includes determining the regions that the pixels in the template image are associated with based on properties of the device, defects of interest (DOI), known nuisance defects, or some combination thereof. For example, segmentation schemes can be formed to partition the device context into multiple regions based on the device physics, DOI at the moment, and/or the presence of dominating nuisances. In many cases, the locations of DOI within a cell or a device are known as is the location of noise and/or nuisance. Such information can be used to separate the regions in the template image into those that correspond to DOI and those that do not. The device context-based segmentation scheme can be formulated with the assistance of design-based hot spot analysis software. In addition, from an abstracted unit cell context, the user can mark out the areas of interest, and these may be the only areas to be inspected for defects during the inspection. However, the determination of the regions may be completely automated.

In one embodiment, at least one of the regions corresponds to only a single contact within a repeating memory cell structure of the device. For example, regions can be as small as individual contacts within a repeating memory cell structure. In addition, one or more of the regions may be as small a contact or as any other feature or structure in the device while other regions may include more than one feature, a layer, etc.

In another embodiment, at least some of the regions correspond to different types of contacts within a repeating memory cell structure of the device. For example, FIG. 1 shows one embodiment of a template image that can be used for an inspection of a memory cell structure. As described further herein, the device context for a unit cell can be identified from a design database or from a high resolution image. The segmentation scheme shown in FIG. 1 may partition the structures in this portion of the device into the background dielectric, different groups of contacts, and particular locations within the context to be different regions. For example, as shown in FIG. 1, one group of contacts to having one type may be identified as first regions 10 that are ROI or DOI areas. Another group of contacts having a second type different than the first group may be identified as second regions 12 that are also ROI or DOI areas. An additional group of contacts having a third type different than the first and second groups may be identified as third regions 14 that are not ROI. For example, this group of contacts may be contacts in or near which no DOIs are located. Fourth regions 16 may be identified as locations near some of the contacts that are of interest as perhaps containing DOI. The dielectric background may be identified as fifth region 18 that is not a region of interest. The device context may then be rendered into a template image appropriate for matching with images from the upcoming inspection, which can be performed as described further herein.

In some embodiments, at least one of the regions corresponds to an oxide area between contacts in a repeating memory cell structure of the device, and applying defect detection parameters as described further herein is not performed for the oxide area. For example, some regions can be excluded from the inspection such as the oxide area between contacts. In the example shown in FIG. 1, fifth region 18 that includes the dielectric background between contacts in a repeating memory cell structure may be indicated as a non-ROI and defect detection may not be performed for pixels located in that region.

As described herein, the regions may be defined based on electrical characteristics of features in the device, known DOI, and known nuisances. Therefore, regions that may produce output in the inspection system having similar characteristics (e.g., noise, signal, signal-to-noise ratio, brightness, contrast, and any other image, signal, or data characteristics) may be separated into different regions. In other words, unlike other methods that may separate pixels based on image characteristics, the embodiments described herein may separate at least some of the inspection area into regions without regard to how the regions affect the inspection system output.

In an additional embodiment, the method includes generating multiple template images using the information about the device, and each of the multiple template images is generated for one of multiple pixel sizes and optical conditions for the electron beam inspection system described further herein. For example, the template image (i.e., the abstracted unit cell context) may be rendered to the pixel size of the inspection system (i.e., the correct pixel size). In addition, a relatively high resolution template unit cell can be rendered to be used in multiple pixel sizes and/or optics conditions. In this manner, the template image may be rendered to simulate how the portion of the device corresponding to the template image will appear to the inspection system thereby increasing the ability of the method to correctly match the template image to the output of the inspection system. In addition, when there are more than one template image, each of which corresponds to different pixel sizes and/or other optical conditions of the inspection system, the correct template image may be selected at the beginning of the inspection based on the parameters of the inspection system in the inspection recipe that will be used for inspection of the wafer.

The method also includes acquiring output of an electron beam inspection system for the wafer. Acquiring the output may include actually performing an inspection of the wafer (e.g., by scanning the wafer using the electron beam inspection system). However, acquiring the output may not include performing an inspection on the wafer. For example, acquiring the output may include acquiring the output from a storage medium in which the output has been stored by another method or the electron beam inspection system. The inspection may include any suitable inspection including any of those described further herein. The output may include any and all output that may be generated by an inspection process or system.

Figure 2:
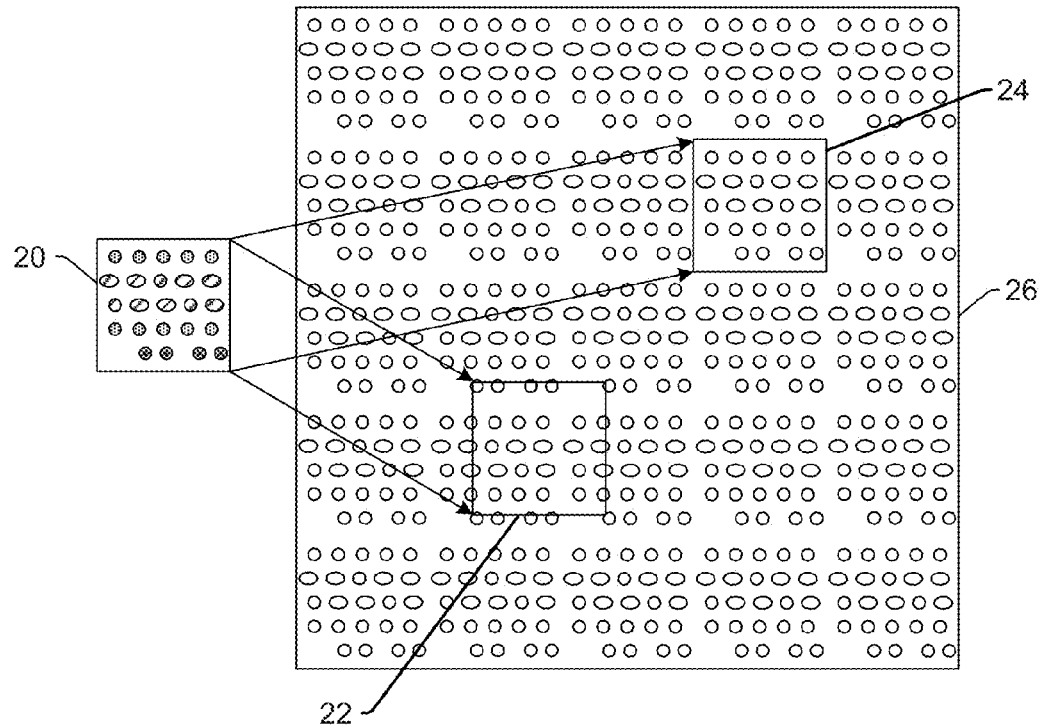
FIG. 2 is a schematic diagram illustrating one embodiment of matching a template image to output generated by an electron beam inspection system.

The method further includes matching the template image to the output based on patterns in the template image and the output. For example, during the inspection process, the device context template image is matched to the acquired output (e.g., an inspection image or images) to determine the location of the context (e.g., each unit cell context) within the inspection image. In particular, pattern matching may be used to locate the unit cell or portion of the device corresponding to the template image within the array region or another region of the device. In one such embodiment, as shown in FIG. 2, template image 20 may be moved to various positions 22 and 24 within inspection image 26 until a match is found. For example, template image 20 may be overlaid with the inspection image at position 22 and since a match of the patterns in the template image and that portion of the inspection image is not found, the template image may be overlaid with the inspection image at the other position, position 24, where a match between the patterns is found.

As shown in FIG. 2, the template image may be smaller than the inspection image such that the inspection image contains enough pixels such that a match between the template image and the inspection image can be found. In addition, as shown in FIG. 2, multiple portions of the inspection image may match the template image. As such, multiple matches between different portions of the inspection image and the template image may be searched for and found or one instance of a match between the inspection image and the template image may be found and then the matching may be propagated through the inspection image as described further herein.

As further shown in FIG. 2, the template image may include information about the different regions within the template image (i.e., the different regions that various contacts are assigned to). However, the template image and the information about the different regions may be stored in different data structures (e.g., if the information about the different regions will make the matching step more difficult).

A match between the template image and the output of the electron beam inspection system may be declared in situations in which a "perfect" match cannot be found. For example, "matching" may include searching for "perfect matches" and also matches within some range of uncertainty or error. In this manner, the matching may be performed while taking into account the fact that the output of the electron beam inspection system may vary due to variations in the wafer itself, which may be caused by, for example, variations in the parameters of the process used to form the patterns on the wafer.

In one embodiment, the template image corresponds to a unit cell within an array region of the device, and matching the template image to the output includes matching the template image to the pixels in the output corresponding to one unit cell in the array region based on the patterns and propagating the matching throughout the array region based on information about the unit cell and the array region. For example, the unit cell may be propagated throughout the array region utilizing the array cell size and a small search range. In other words, if the template image corresponds to one unit cell, since the array region is made up of multiple unit cells, once a match between the template image and some portion of the output has been found, the template image will be matched to one unit cell in the output. Information about the dimensions and arrangement of the unit cells in the array region may then be used to identify other unit cells in the output without performing the matching. Propagating the matching in this manner may be advantageous because it may speed up the inspection process overall and, in instances in which the wafer properties vary across unit cells in the same array region, propagating the matching in this manner can increase the accuracy in which the locations of the unit cells in the output can be identified.

In another embodiment, the template image corresponds to a unit cell within an array region of the device, and matching the template image to the output is performed for an entire row and column of unit cells within a care area in the array region. For example, in "smart" array inspection, pattern matching of the template image to the inspection pixels may be performed for a complete row and column of cells within the array care area. The array care area may be determined in any suitable manner by the embodiments described herein or another method or system.

In some embodiments, the template image corresponds to a unit cell within an array region of the device, and the matching is performed for every unit cell within the array region. For example, for array real time alignment (RTA), pattern matching may be to performed for every unit cell inside the array region. In addition, the alignment can be performed in both the x and y directions, similar to multi-segmented alignment (MS).

The method also includes identifying the regions that pixels in the output are located within based on the regions that are associated with the pixels in the template image that match the pixels in the output. In this manner, during the inspection, the locations of the different regions are identified according to the details of the device context resolved in the image. Each pixel in the image can then be allocated to one of the predetermined regions. In this manner, rendering and matching of the device context is performed for the purpose of identifying the location of the context within the inspection image. In addition, the device context-based segmentation of the inspection image can be performed prior to defect detection. As such, the embodiments described herein can be used to "bin" pixels in the inspection image before inspection is performed using those pixels.

In one embodiment, identifying the regions includes overlaying a region segmentation scheme onto the pixels in the output that match the template image. For example, once the location of the context within the inspection image is obtained, the region segmentation scheme may be overlaid on the inspection image to partition all pixels in the inspection image into different regions. In addition, once the location of each unit cell context is obtained, the region segmentation scheme may be applied in any other manner and all pixels in the inspection image may be partitioned into appropriate regions.

The method also includes applying defect detection parameters to the pixels in the output based on the regions that the pixels are located within to thereby detect defects on the wafer. In this manner, the embodiments described herein are configured for context sensitive electron beam wafer inspection. For example, pixels in the different regions can be processed separately using different defect detection methods that are appropriate for each individual region. In one such example, pixels in each region can be processed to with different detection methods or ignored altogether if desired. For example, there could be multiple groups of areas of interest, and each group could have its own threshold, defect detection method, or defect detection parameters. In another example, during inspection of the context regions, since the exact location of each feature within a cell is known due to the matching described herein, each of the regions may be histogrammed and inspected separately with their individual threshold method and parameters. In addition, some areas can be marked as background and will not be inspected.

In this manner, context sensitive inspection (CSI) may utilize the design knowledge of a unit cell within an array region or of any other region within a device to perform targeted inspections of specific ROIs at sensitive locations where the DOI are expected to occur. In addition, the embodiments described herein can be used to determine the location of each unit cell within a swath image and the location of the ROIs within the cell such that only the part of the cell that is of potential interest needs to be inspected while leaving out uninteresting background areas. In this manner, only the pixels within the user-defined areas of interest can be inspected for defects. Therefore, nuisances outside these areas do not decrease the signal-to-noise ratio for DOI and do not need binning to filter out. As such, the embodiments described herein provide a sensible way for a user to perform targeted inspection based on the design knowledge of the device context. In addition, segmentation of the inspection image gives the user the flexibility to customize the inspection for each region thereby making possible new ways to suppress nuisance defects and improve inspection sensitivity for DOIs. Furthermore, optics selection could utilize the reduction in nuisance detection due to the methods described herein to increase the signal-to-noise ratio for DOI only, with no need to suppress irrelevant nuisances. In one such example, the embodiments described herein can be used with optics selector, which may be configured and/or performed as described in U.S. Pat. No. 8,073,240 issued on Dec. 6, 2011 to Fischer et al., which is incorporated by reference as if fully set forth herein, and even image optimization, where the gain of the inspection system is adjusted to maximize contrast of the ROI.

In one embodiment, the defect detection parameters include whether or not to perform defect detection in one or more of the regions and, for the regions in which the defect detection is to be performed, a threshold that depends on the regions in which the pixels are located, and the threshold is to be applied to a difference between the pixels in the output and reference pixels. For example, after the region segmentation scheme has been applied to pixels in the inspection image, defect detection can be performed on the predetermined DOI regions (each with its own detection threshold) only, while ignoring all information from the background dielectric and non-DOI regions. The detection threshold of each region can be set individually. In one such example, knowing the layout of a cell, each contact could be assigned its own region with its own threshold. Regions where a relatively small DOI is expected can be inspected with relatively high sensitivity while other regions that may contain lots of leakage nuisance defects can be detuned. In addition, regions that contain significant noise can be excluded before they overwhelm a defect detection algorithm. Therefore, thresholds can be significantly lowered in other regions, which could make possible or optimize the detection of DOI.

In one such example, a memory structure that is relatively well-resolved with electron beam inspection system optics can be partitioned into individual contact types such as PMOS/NMOS/Bitline or Wordline contacts, etc. The threshold for each of these contacts can be set individually. For example, if one contact type is prone to leakage-induced gray level variation that is considered a nuisance, its detection threshold can be detuned so as to not overwhelm the inspection result with nuisances. The segmentation of these leakage-proven contacts also prevents the leakage signal from impacting the detection sensitivity of defects from other regions, which can greatly improve the overall inspection sensitivity to the defect types that the customer is interested in.

In another embodiment, applying the defect detection parameters includes averaging multiple pixels in the output corresponding to multiple unit cells in an array region of the device to generate a reference image, subtracting the reference image from a test image in the output that corresponds to one of the multiple unit cells to generate a difference image, and applying the defect detection parameters to the difference image based on the regions that pixels in the difference image are located within. For example, for cell averaging, neighboring cells can be averaged for a relatively low noise reference image, without the restriction of alignment. Cells from above and below can be used in the averaging as well.

In one embodiment, the method includes automatically associating the detected defects with the regions in which they are located. In other words, defects that are detected as described herein can be automatically associated with the region in which they are detected. For example, all defects detected in inspections described herein can be associated with a particular region and relative location within the unit cell context.

The above-described information can then be used for further classification of the defects. For example, in another embodiment, the method includes classifying the detected defects based on the regions in which they are located. In this manner, any defect that is detected during an inspection can be automatically classified by the region it was found in. As such, the information about the region in which the defects are detected can be used for further classification of the defects. In addition, classifying the detected defects may include using the region and location-within-context information for each defect (automatically obtained from the device context-based segmentation) for the purpose of defect classification. In this manner, defects detected during the inspection may be classified according to the device context-based region and/or location thereby giving the user useful information relevant to the design faster.

In some embodiments, each contact type in the device is associated with a different one of the regions, and the method includes displaying density of the detected defects in each contact type. For example, detected defects can be automatically binned by region based on the region in the template image that they are located within. Therefore, wafer maps of each defect type would be trivial to generate. In addition, every contact type can be set as its own ROI. After the inspection, the defect density of each contact type can be displayed in any suitable manner. In one such example, defect density can be displayed for PMOS contact defects, Bitline contact mis-shaped defects, Bitline contact open defects, Wordline contact open defects, and/or NMOS S/D contact open defects.

Generating the template image, acquiring the output, matching the template image to the output, identifying the regions, and applying the defect detection parameters are performed using a computer system, which may be configured as described further herein.

Although some of the steps of the method are described herein with respect to memory cell portions of a device, similar operations can be performed for non-memory cell parts of the wafer if the relevant design database is available.

All of the methods described herein may include storing results of one or more steps of the method embodiments in a non-transitory, computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Each of the embodiments of the method described above may include any other step(s) of any other method(s) described herein. In addition, each of the embodiments of the method described above may be performed by any of the systems described herein.

Figure 3:
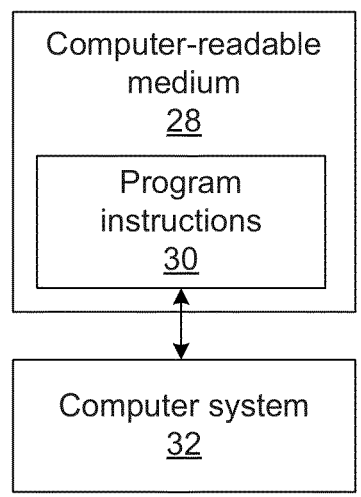
FIG. 3 is a block diagram illustrating one embodiment of a non-transitory computer-readable medium.

Another embodiment relates to a non-transitory computer-readable medium containing program instructions stored therein for causing a computer system to perform a computer-implemented method for detecting defects on a wafer. One embodiment of such a computer-readable medium is shown in FIG. 3. In particular, computer-readable medium 28 contains program instructions 30 stored therein for causing computer system 32 to perform a computer-implemented method for detecting defects on a wafer.

The computer-implemented method includes the steps of the method described herein. The computer-implemented method may also include any other step(s) of any other method(s) described herein. In addition, the computer-readable medium may be further configured as described herein.

Program instructions 30 implementing methods such as those described herein may be stored on computer-readable medium 28. The computer-readable medium may be a non-transitory computer-readable storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Computer system 32 may take various forms, including a personal computer system, mainframe computer system, workstation, image computer, parallel processor, or any other device known in the art. In general, the term "computer system" may be broadly defined to encompass any device having one or more processors, which executes instructions from a memory medium.

Figure 4:
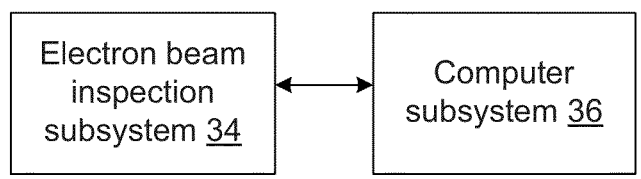
FIG. 4 is a block diagram illustrating one embodiment of a system configured to detect defects on a wafer.

FIG. 4 illustrates one embodiment of a system configured to detect defects on a wafer. The system includes electron beam inspection subsystem 34 configured to acquire output for a wafer. The electron beam inspection subsystem may include an existing inspection subsystem (e.g., by adding functionality described herein to an existing inspection system) such as any of the inspection tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

The system also includes computer subsystem 36 configured to generate a template image using information about a device being formed on the wafer, according to any of the embodiments described herein. As described further herein, at least some pixels in the template image are associated with regions in the device having different characteristics. The computer subsystem is also configured to match the template image to the output based on patterns in the template image and the output, which may be performed according to any of the embodiments described further herein. In addition, the computer subsystem is configured to identify the regions that pixels in the output are located within based on the regions that are associated with the pixels of the template image that match the pixels in the output, which may be performed according to any of the embodiments described further herein. The computer subsystem is further configured to apply defect detection parameters to the pixels in the output based on the regions that the pixels are located within to thereby detect defects on the wafer, which may be performed according to any of the embodiments described further herein. The computer subsystem and the system may be further configured to perform any other step(s) of any method(s) described herein.

Further modifications and alternative embodiments of various aspects of the invention will be apparent to those skilled in the art in view of this description. For example, methods and systems for detecting defects on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for detecting defects on a wafer, comprising:
generating a template image using information about a device being formed on a wafer, wherein at least some pixels in the template image are associated with regions in the device having different characteristics;

acquiring output of an electron beam inspection system for the wafer;

separating the template image into different regions that correspond to different regions in the device prior to acquiring the output;

determining which of the different regions in the device that the pixels in the template image are located in based on results of said separating prior to acquiring the output;

matching the template image to the output based on patterns in the template image and the output;

identifying the regions in the device that pixels in the output are located within based on the pixels of the template image that match the pixels in the output and the different regions in the device in which the pixels of the template image are located, wherein said generating, said acquiring, said separating, said determining, said matching, and said identifying are performed prior to defect detection performed for the wafer; and applying defect detection parameters to the pixels in the output based on the regions in the device that the pixels in the output are located within to thereby detect defects on the wafer, wherein said generating, said acquiring, said separating, said determining, said matching, said identifying, and said applying are performed using a computer system.

2. The method of claim 1, wherein the information comprises design data for the device.

3. The method of claim 1, wherein the information comprises a high resolution image of the device being formed on the wafer.

4. The method of claim 1, wherein determining which of the different regions in the device that the pixels in the template image are located in is performed based on properties of the device, defects of interest, known nuisance defects, or some combination thereof.

5. The method of claim 1, wherein at least one of the regions in the device corresponds to only a single contact within a repeating memory cell structure of the device.

6. The method of claim 1, wherein at least some of the regions in the device correspond to different types of contacts within a repeating memory cell structure of the device.

7. The method of claim 1, wherein at least one of the regions in the device corresponds to an oxide area between contacts in a repeating memory cell structure of the device, and wherein said applying is not performed for the oxide area.

8. The method of claim 1, further comprising generating multiple template images using the information about the device, wherein each of the multiple template images is generated for one of multiple pixel sizes and optical conditions for the electron beam inspection system.

9. The method of claim 1, wherein the template image corresponds to a unit cell within an array region of the device, and wherein said matching comprises matching the template image to the pixels in the output corresponding to one unit cell in the array region based on the patterns and propagating the matching throughout the array region based on information about the unit cell and the array region.

10. The method of claim 1, wherein the template image corresponds to a unit cell within an array region of the device, and wherein said matching is performed for an entire row and column of unit cells within a care area in the array region.

11. The method of claim 1, wherein the template image corresponds to a unit cell within an array region of the device, and wherein said matching is performed for every unit cell within the array region.

12. The method of claim 1, wherein said identifying comprises overlaying a region segmentation scheme onto the pixels in the output that match the template image.

13. The method of claim 1, wherein the defect detection parameters comprise whether or not to perform defect detection in one or more of the regions in the device and for the regions in the device in which the defect detection is to be performed, a threshold that depends on the regions in the device in which the pixels in the output are located, and wherein the threshold is to be applied to a difference between the pixels in the output and reference pixels.

14. The method of claim 1, wherein said applying comprises averaging multiple pixels in the output corresponding to multiple unit cells in an array region of the device to generate a reference image, subtracting the reference image from a test image in the output that corresponds to one of the multiple unit cells to generate a difference image, and applying the defect detection parameters to the difference image based on the regions in the device that pixels in the difference image are located within.

15. The method of claim 1, further comprising automatically associating the detected defects with the regions in the device in which they are located.

16. The method of claim 1, further comprising classifying the detected defects based on the regions in the device in which they are located.

17. The method of claim 1, wherein each contact type in the device is associated with a different one of the regions in the device, the method further comprising displaying density of the detected detects in said each contact type.

18. A non-transitory computer-readable medium containing program instructions stored therein for causing a computer system to perform a computer-implemented method for detecting defects on a wafer, wherein the computer-implemented method comprises:

generating a template image using information about a device being formed on a wafer, wherein at least some pixels in the template image are associated with regions in the device having different characteristics;

acquiring output of an electron beam inspection system for the wafer;

separating the template image into different regions that correspond to different regions in the device prior to acquiring the output;

determining which of the different regions in the device that the pixels in the template image are located in based on results of said separating prior to acquiring the output;

matching the template image to the output based on patterns in the template image and the output;

identifying the regions, in the device that pixels in the output are located within based on the pixels of the template image that match the pixels in the output and the different regions in the device in which the pixels of the template image are located, wherein said generating, said acquiring, said separating, said determining, said matching, and said identifying are performed prior to defect detection performed for the wafer; and applying defect detection parameters to the pixels in the output based on the regions in the device that the pixels in the output are located within to thereby detect defects on the wafer.

19. A system configured to detect defects on a wafer, comprising:

an electron beam inspection subsystem configured to acquire output for a wafer; and a computer subsystem configured to:

generate a template image using information about a device being formed on the wafer, wherein at least some pixels in the template image are associated with regions in the device having different characteristics;

separate the template image into different regions that correspond to different regions in the device prior to acquisition of the output by the electron beam inspection subsystem;

determine which of the different regions in the device that the pixels in the template image are located in based on results of separating the template image into the different regions prior to acquisition of the output by the electron beam inspection subsystem;

match the template image to the output based on patterns in the template image and the output;

identify the regions in the device that pixels in the output are located within based on the pixels of the template image that match the pixels in the output and the different regions in the device in which the pixels of the template image are located, wherein the computer subsystem is further configured to generate the template image, separate the template image, determine which of the different regions, match the template image, and identify the regions prior to defect detection performed for the wafer; and apply defect detection parameters to the pixels in the output based on the regions in the device that the pixels in the output are located within to thereby detect defects on the wafer.

20. The system of claim 19, wherein the information comprises design data for the device.

21. The system of claim 19, wherein the information comprises a high resolution image of the device being formed on the wafer.

22. The system of claim 19, wherein the computer subsystem is further configured to determine which of the different regions in the device that the pixels in the template image are located in based on properties of the device, defects of interest, known nuisance defects, or some combination thereof.

23. The system of claim 19, wherein at least one of the regions in the device corresponds to only a single contact within a repeating memory cell structure of the device.

24. The system of claim 19, wherein at least some of the regions in the device correspond to different types of contacts within a repeating memory cell structure of the device.

25. The system of claim 19, wherein at least one of the regions in the device corresponds to an oxide area between contacts in a repeating memory cell structure of the device, and wherein the defect detection parameters are not applied to the pixels within the oxide area.

26. The system of claim 19, wherein the computer subsystem is further configured to generate multiple template images using the information about the device, and wherein each of the multiple template images is generated for one of multiple pixel sizes and optical conditions for the electron beam inspection subsystem.

27. The system of claim 19, wherein the template image corresponds to a unit cell within an array region of the device, and wherein the computer subsystem is further configured to match the template image to the output by matching the template image to the pixels in the output corresponding to one unit cell in the array region based on the patterns and propagating the matching throughout the array region based on information about the unit cell and the array region.

28. The system of claim 19, wherein the template image corresponds to a unit cell within an array region of the device, and wherein the computer subsystem is further configured to match the template image to the output for an entire row and column of unit cells within a care area in the array region.

29. The system of claim 19, wherein the template image corresponds to a unit cell within an array region of the device, and wherein the computer subsystem is further configured to match the template image to the output for every unit cell within the array region.

30. The system of claim 19, wherein the computer subsystem is further configured to identify the regions that the pixels in the output are located within by overlaying a region segmentation scheme onto the pixels in the output that match the template image.

31. The system of claim 19, wherein the defect detection parameters comprise whether or not to perform defect detection in one or more of the regions in the device and for the regions in the device in which the defect detection is to be performed, a threshold that depends on the regions in the device in which the pixels in the output are located, and wherein the threshold is to be applied to a difference between the pixels in the output and reference pixels.

32. The system of claim 19, wherein the computer subsystem is further configured to apply the defect detection parameters by averaging multiple pixels in the output corresponding to multiple unit cells in an array region of the device to generate a reference image, subtracting the reference image from a test image in the output that corresponds to one of the multiple unit cells to generate a difference image, and applying the defect detection parameters to the difference image based on the regions in the device that pixels in the difference image are located within.

33. The system of claim 19, wherein the computer subsystem is further configured to automatically associate the detected defects with the regions in the device in which they are located.

34. The system of claim 19, wherein the computer subsystem is further configured to classify the detected defects based on the regions in the device in which they are located.

35. The system of claim 19, wherein each contact type in the device is associated with a different one of the regions in the device, and wherein the computer subsystem is further configured to display density of the detected defects in said each contact type.

* * * * *